(12) United States Patent  
Manabe et al.

(10) Patent No.: US 8,804,021 B2
(45) Date of Patent: Aug. 12, 2014

(54) METHOD, APPARATUS AND SYSTEM FOR PROVIDING IMPROVED FULL WELL CAPACITY IN AN IMAGE SENSOR PIXEL

(75) Inventors: Sohei Manabe, San Jose, CA (US); Keh-Chiang Ku, Cupertino, CA (US); Vincent Venezia, Los Gatos, CA (US); Hsin-Chih Tai, San Jose, CA (US); Duli Mao, Sunnyvale, CA (US); Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 463 days.

(21) Appl. No.: 13/288,880

(22) Filed: Nov. 3, 2011

(65) Prior Publication Data

US 2013/0113969 A1    May 9, 2013

(51) Int. Cl.
*H04N 3/14* (2006.01)
*H04N 5/335* (2011.01)

(52) U.S. Cl.
USPC ............................................. 348/308

(58) Field of Classification Search
None
See application file for complete search history.

(56) References Cited

U.S. PATENT DOCUMENTS

| | | | |
|---|---|---|---|
| 5,851,886 A * | 12/1998 | Peng | 438/289 |
| 6,465,820 B1 | 10/2002 | Fox | |
| 6,690,423 B1 * | 2/2004 | Nakamura et al. | 348/311 |
| 7,420,233 B2 * | 9/2008 | Rhodes et al. | 257/292 |
| 7,935,557 B2 * | 5/2011 | Mishima et al. | 438/60 |
| 8,003,424 B2 * | 8/2011 | Lee et al. | 438/60 |
| 2002/0003611 A1 | 1/2002 | Ohashi | |
| 2010/0173444 A1 | 7/2010 | Mishima et al. | |
| 2011/0025892 A1 | 2/2011 | Hibbeler et al. | |

OTHER PUBLICATIONS

EP12190843.8-Extended European Search Report, dated Jul. 26, 2013 (9 pages).

* cited by examiner

*Primary Examiner* — Justin P Misleh
(74) *Attorney, Agent, or Firm* — Blakely Sokoloff Taylor & Zafman LLP

(57) ABSTRACT

Techniques and mechanisms for improving full well capacity for pixel structures in an image sensor. In an embodiment, a first pixel structure of the image sensor includes an implant region, where a skew of the implant region corresponds to an implant angle, and a second pixel structure of the image sensor includes a transfer gate. In another embodiment, an offset of the implant region of the first pixel structure from the transfer gate of the second pixel structure corresponds to the implant angle.

20 Claims, 11 Drawing Sheets

|  |  |  |
|---|---|---|
| Tx Gate 390b | FD 395y | Tx Gate 390d |
| Photodiode 395b |  | Photodiode 395d |
| Tx Gate 390a | FD 395x | Tx Gate 390c |
| Photodiode 395a |  | Photodiode 395c |

METHOD, APPARATUS AND SYSTEM FOR PROVIDING IMPROVED FULL WELL CAPACITY IN AN IMAGE SENSOR PIXEL

BACKGROUND

1. Technical Field

Embodiments of the invention relate generally to integrated circuit structures, and more particularly, but not exclusively, relate to techniques for increasing full well capacity of pixel structures in an image sensor.

2. Background Art

An image sensor converts a visual image into digital data that may be represented as a picture. Digital cameras and video imaging devices employ such image sensors, for example. The image sensor typically includes an array of pixels—unit integrated circuit (IC) structures for the conversion of the visual image into digital data. Image sensors often include complementary metal oxide semiconductor (CMOS) IC elements, for example.

Recently, image sensors have been designed for backside illumination ("BSI"). BSI refers to an arrangement of imaging elements in an image sensor in which one side of a semiconductor substrate, on which photosensitive regions and their associated pixel and image processing circuits are fabricated, is designated as the front side, while the illumination from an object to be imaged is received through the opposite surface of the substrate—or its backside. In BSI image sensors, illumination occurs without interference from any metal or oxide layers that form, for example, the transistor components of the pixel cell and associated interconnects, allowing incident electromagnetic energy a more direct path through the photodiode. In a front-side illumination ("FSI") image sensor, by contrast, the light from an image strikes the substrate on the side of the substrate where the polysilicon gate electrode, oxide and metal interconnect layers reside, and so care must be taken to ensure that the photo-sensitive region of an FSI pixel cell is not covered by polysilicon or metal layers. Therefore, more electromagnetic energy can typically reach a photodiode in a BSI configuration, which may improve image quality.

Improvements in IC fabrication continue to reduce the size of components in image sensors. Consequently, successive generations of pixel arrays have implemented successively smaller IC design features, such that certain design features are now smaller than the wavelengths of visible light. Such advances have enabled CMOS image sensors, for example, to locate increasingly large numbers of decreasingly small pixels within the same or smaller IC footprints. With decreasing sizes of components in image sensors, it becomes increasingly important to more efficiently capture incident light that illuminates their sensing arrays. That is, more efficiently capturing incident light helps to maintain or improve the quality of electronic images captured by these successively smaller sensing arrays. To the same end, it has become increasingly important to increase, or at least maintain, the photosensitive area within individual pixels—e.g. as compared to the total area allocated to that pixel.

BRIEF DESCRIPTION OF THE DRAWINGS

The various embodiments of the present invention are illustrated by way of example, and not by way of limitation, in the figures of the accompanying drawings and in which:

FIG. 3C is a layout diagram illustrating an image sensor according to an embodiment.

DETAILED DESCRIPTION

Figure 1:
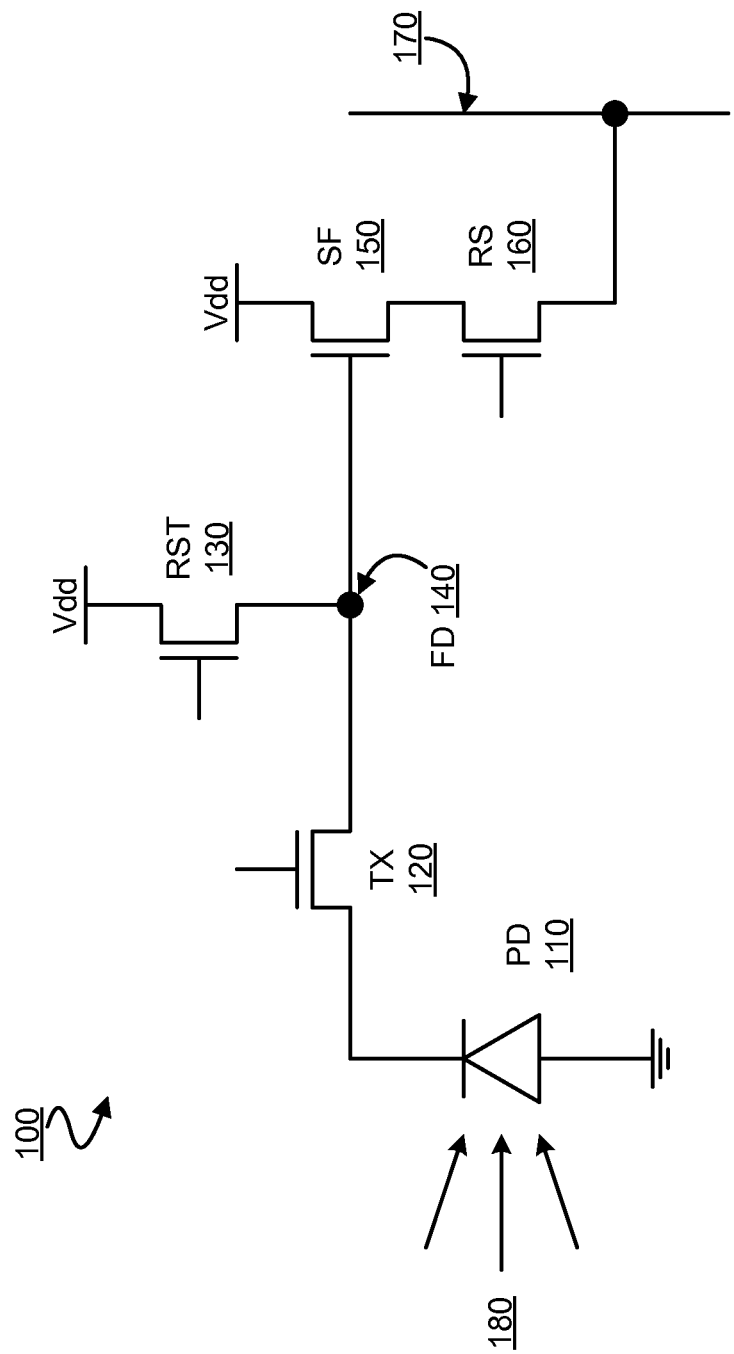
FIG. 1 is circuit diagram illustrating elements of a pixel cell of an image sensor according to an embodiment.

Embodiments discussed herein variously provide for improved fill factor of an imaging pixel (e.g., the ratio of a photodiode region of a pixel to the total footprint of the pixel) and/or for an improved symmetry of pixels with respect to one another in an image sensor. For example, certain embodiments provide for image sensor pixels with self-aligned components to reduce overall pixel size while maintaining large photodiode size and full well capacity, as compared to pixel structures implemented according to conventional techniques. Larger fill factors help to improve the amount of light that is collected by a pixel, while pixel symmetry helps to reduce fixed pattern noise and color shading. Fixed pattern noise can arise from pixel design variations and/or process variations in the pixel array of the image sensor. Color shading can arise from different frequency responses of pixels having different design geometries. Fill factor and/or pixel symmetry may be improved by pixel structures variously implemented by certain embodiments.

Certain embodiments additionally or alternatively provide image sensor pixels with reduced use of shallow trench isolation ("STI"), as compared to pixel structures implemented according to conventional techniques. To further improve the number of pixels per unit area (pixel density), some embodiments include commonly shared floating diffusion (FD) regions from which pixel signals may be sensed and from which pixels may be reset.

As defined herein, an "image sensor pixel" refers to a unit element of an image sensor that generates an electrical signal from an impinging optical signal. Also as defined herein, an "image sensor pixel structure" is a physical structure that includes at least one image sensor pixel and optionally one or more additional structures that manipulate an electrical signal from any of the at least one image sensor pixel. An image sensor pixel may include IC structures to operate, for example, in combination with any of a variety of devices such as logic devices, imagers (including CMOS and CCD imagers), and memory (such as DRAM and NOR- and NAND-based flash memory devices). Such devices may, for example, employ transistors for a variety of functions, including switching and amplification of signals.

Transistors may be formed in integrated circuits by photolithographic processes that are performed on a silicon substrate. Processes to form such transistors may, for example, include operations such as applying a photolithographic resist layer to the substrate, exposing the resist layer to a pattern using light (including deep ultra-violet wavelengths), removing the exposed portions (or non-exposed portions) of the photoresist by etching, and modifying the exposed structure, for example, by depositing or ion implanting additional materials to form various structures for electronic components (including transistors).

As used herein, the term "substrate" refers to any of a variety of substrates formed using semiconductor material—e.g. based upon silicon, silicon-germanium, germanium, gallium arsenide and/or the like. A substrate layer may include such a substrate and one or more structures resulting from operations that have been performed upon the substrate—e.g. such operations forming regions, junctions and/or other structures in the substrate. By way of illustration and not limitation, such structures may include one or more of doped semiconductor regions and/or undoped semiconductor regions, epitaxial layers of silicon, and other semiconductor structures formed upon the substrate.

In an embodiment, chemical-mechanical planarization (CMP) may be performed to render the surface of a modified substrate suitable for forming additional structures. Such additional structures may, for example, be added to the substrate by performing additional processing operations, such as those listed above. In an embodiment, ion implantation of dopants into selected regions of a substrate may be used to electrically isolate regions disposed within a substrate by exploiting the characteristics of reverse biased diodes. Shallow trench isolation (STI), which uses dielectric filled trenches to effect electrical isolation, is another method for isolating regions disposed within a substrate.

FIG. 1 is a circuit diagram of a four transistor ("4T") unit pixel cell 100 of an imaging sensor according to an embodiment. Features of various embodiments are discussed herein with respect to the illustrative 4T pixel cell 100. However, the discussion of such features may be extended to apply to any of a variety of additional and/or alternative pixel structures—e.g. 3T pixels, 5T pixels and/or the like.

In an embodiment, unit pixel cell 100 includes a photodiode ("PD") 110, a transfer transistor ("TX") 120, a reset transistor ("RST") 130, a source-follower amplifier ("SF") 150 and a row select transistor (RS) 160. Each of TX 120, RST 130, SF 150 and RS 160 may, for example, include a source, a drain and a gate. PD 110 may be electrically coupled to the source of TX 120. The drain of TX 120 may be coupled to the drain of RST 130 at a floating drain ("FD") 140 and to the gate of SF 150. The drain of SF 150 may be connected to the source of RS 160. The drain of RS 160 may be connected to a column bus 170. The source of RST 130 and the source of SF 150 may be connected to a supply voltage Vdd.

When TX 120 is turned off, RST 130 may be turned on by a reset pulse, and FD 140 may be subsequently set to a voltage level of approximately Vdd. The voltage at FD 140 may subsequently be amplified by SF 150—for example, when a row select signal is applied to the gate of RS 160. Subsequently, the reset voltage level of Vdd may be transferred to column bus 170.

PD 110 may accumulate electrons in response to exposure of pixel cell 100 to electromagnetic energy (represented by arrows 180)—e.g. such as when an image is being taken on a camera and a shutter of the camera is open. This exposure period is also known as an integration period. At the end of an integration period, a transfer pulse signal may be applied to the gate of TX 120 to turn on TX 120, thereby allowing accumulated electrons (i.e., charge) in PD 110 to transfer to FD 140. SF 150 may convert this charge at FD 140 to a signal voltage. In response to a row select signal being applied to the gate of RS 160, an accumulated voltage level at RS 160 may be transferred to column bus 170. In an embodiment, the voltage on column bus 170 may be sampled at the accumulated voltage level as well as the reset voltage level, such that a difference between the accumulated and reset voltage levels may be identified as a signal voltage which is due to the incidence of electromagnetic energy 180 on photodiode 110.

Before another image is taken during a second integration period, the photodiode 110 itself may be reset. This reset may occur by applying a transfer signal to the gate of TX 120—e.g. while simultaneously applying a reset signal to the gate of RST 130. PD 110 may thus be reset to approximately Vdd, whereupon and the pixel cell may be ready for a second integration period.

The efficiency with which the photosensitive region of a photodiode converts incident electromagnetic energy into accumulated electrons depends on many factors, including the full well capacity (FWC) of the photodiode. FWC is a measure of the number of electrons a photodiode can store before it reaches saturation. When the saturation of a photodiode is reached, excess electrons may overflow to adjacent pixels. Increased photodiode FWC may result in a higher dynamic range and higher signal-to-noise ratio for a CMOS sensor, which ultimately results in higher-quality digital images.

Any accumulated charge in PD 110 that was not transferred from PD 110 to FD 140 via TX 120 may remain in PD 110 after reset, and may contribute to image lag (e.g. due to carry-over of remaining charge from a previous integration period to one or more subsequent integration periods, and thus subsequent images). In addition to causing image lag, electrons remaining in PD 110 after reset may effectively reduce the full well capacity (FWC) of the photodiode for subsequent integration periods. Various embodiments provide techniques for improving FWC and/or reducing image lag.

Figure 2A:
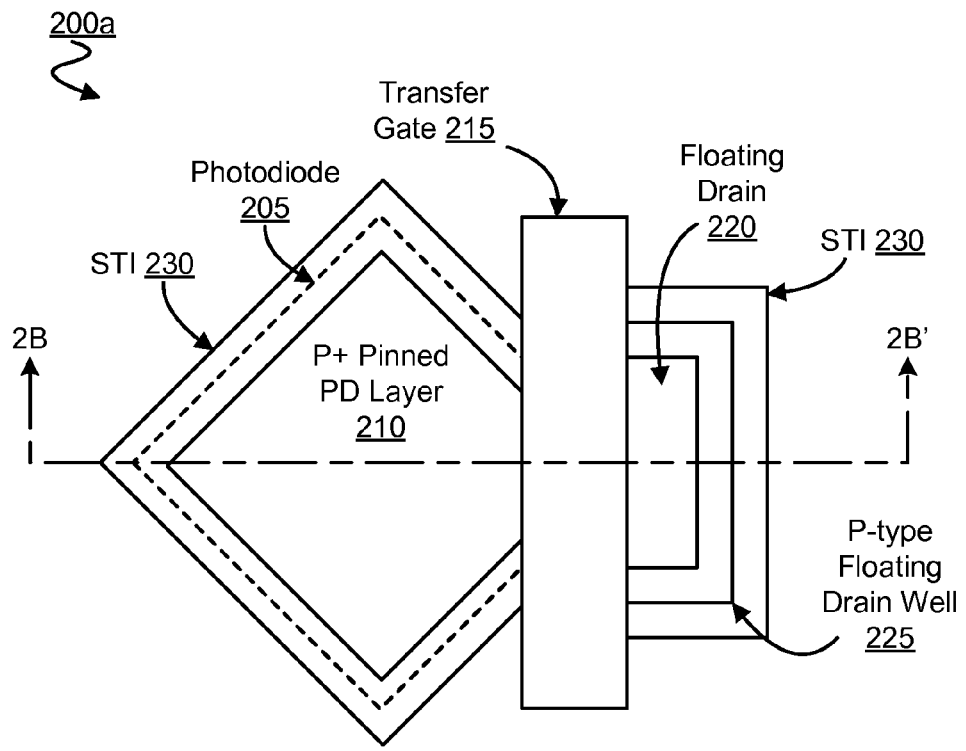
FIG. 2A is a layout diagram illustrating a top view of a conventional pixel structure.
Figure 2B:
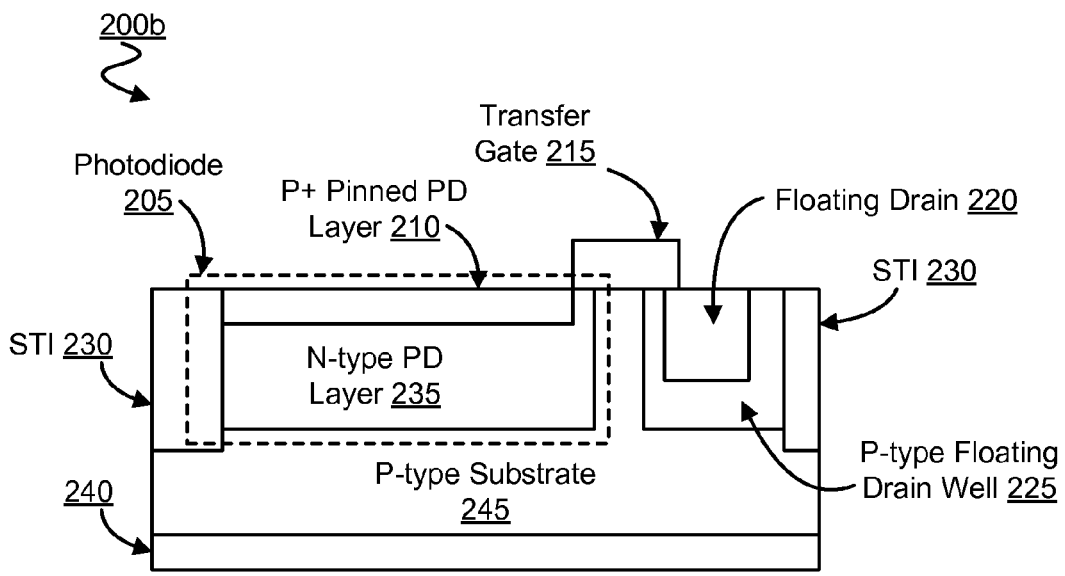
FIG. 2B is a cross-section diagram illustrating a cross-sectional view of a conventional pixel structure.

Turning now to FIGS. 2A and 2B, FIG. 2A shows a top view (also referred to as a "front-side" view) 200a of a conventional pixel structure, while FIG. 2B shows a cross-sectional view 200b of the same pixel structure, the cross-sectional view 200b taken along the line 2B-2B'shown in FIG. 2A.

One type of photodiode common in CMOS image sensors is a pinned photodiode. In particular, a p-n-p pinned photodiode is typically constructed using a p-type semiconductor substrate, an n-type well implanted into the p-type substrate, and a p+ layer implanted into the n-type well. This p+ layer acts as the "pin" in a p-n-p photodiode. As is visible from the top view shown in FIG. 2A, pixel structure 200 includes photodiode 205, a transfer gate 215, a floating drain 220 disposed within a p-type floating drain well 225, and shallow trench isolation (STI) structures 230. For simplicity, only certain elements of the pixel structure associated with portions of transfer gate 215 and photodiode 205 are shown in FIGS. 2A and 2B.

As may be seen in FIG. 2B, the portion of pixel structure 200 further includes a p-doped substrate or epitaxially grown layer 245 and an n-type photodiode implant 235 formed within the front-side of p-doped substrate or epitaxially grown layer 245. Completing the p-n-p structure, p+ pinned photodiode implant layer 210 is disposed on top of an n-type photodiode implant layer 235. Furthermore, a p+ doped layer or substrate extension 213 on the back-side surface of p-type substrate 245 serves as a contact to p-type substrate or epitaxially grown layer 245.

During a given photodiode integration time, electromagnetic energy is incident upon pixel structure 200. STI 230 laterally surrounds and electrically isolates the photodiode 205 from one or more adjacent photodiodes (not shown). As previously mentioned, after the integration period, a transfer pulse signal is applied to transfer gate 215, which separates photodiode 205 from floating drain 220 and p-type floating drain well 225. Accumulated charge then travels along a channel region 260 of substrate 245 from photodiode 205 to floating drain 220. P-type floating drain well 225 isolates p-type substrate 245 from n-type floating drain 220, which has relatively higher doping in comparison to p-type substrate 245.

The electrons flow through the overlap of n-type photodiode implant region 235 and transfer gate 215 and the active channel 260 generated by transfer gate 215 (under transfer gate 215). The region of overlap between transfer gate 215 and the n-type photodiode implant region 235 facilitates the transport of electrons. If the region of overlap is too small, or there is no overlap, it is difficult to remove substantially all the electrons from photodiode 205, which results in image lag. The overlap of the transfer gate 215 reduces the surface region of photodiode 205, which in turn reduces the light collection region of photodiode region 205.

Figure 2C:
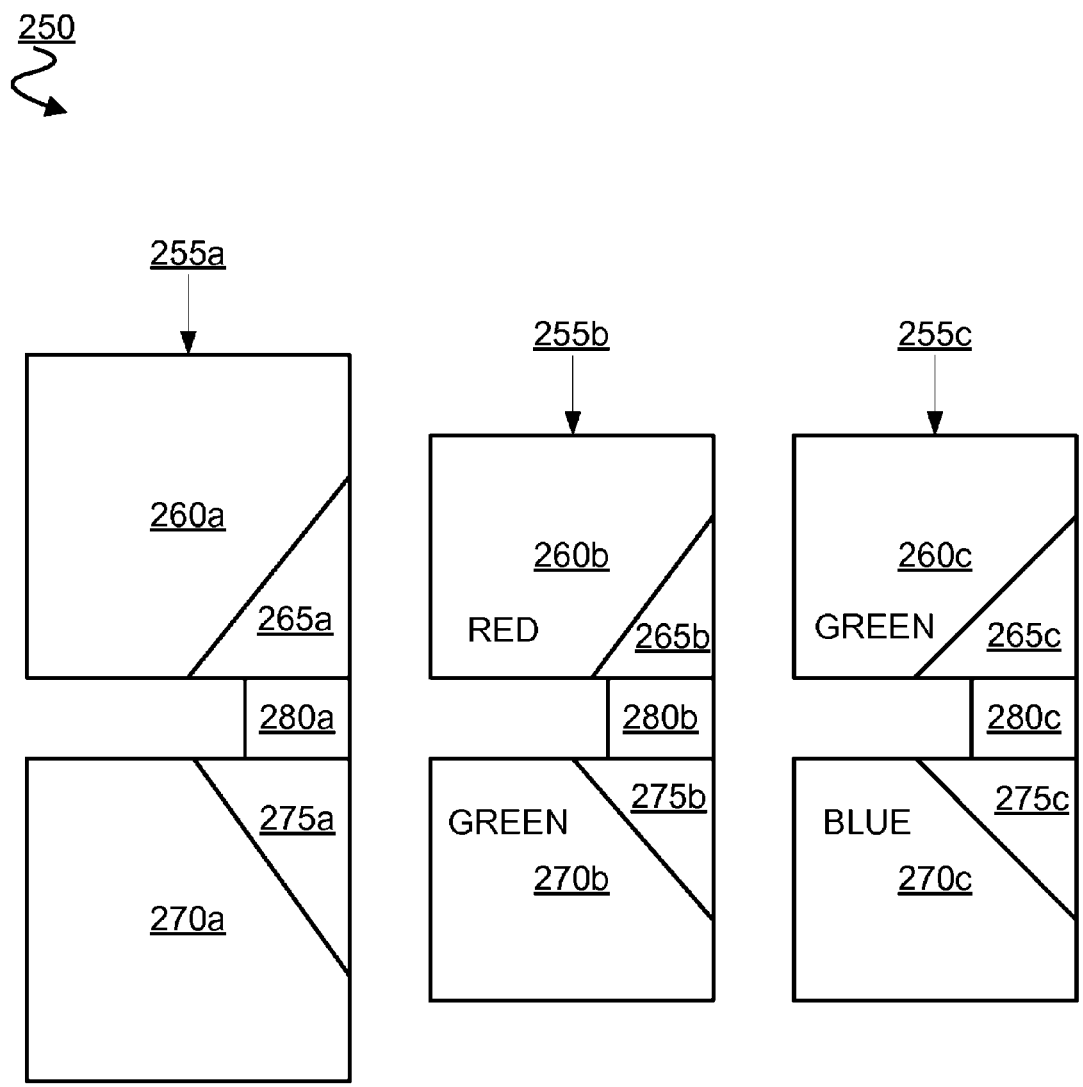
FIG. 2C is a layout diagram illustrating a conventional arrangement of pixel structures.

FIG. 2C illustrates a conventional arrangement 250 of pixel structures which are similar by type to the pixel structure shown in FIGS. 2A and 2B. As discussed herein, arrangement 250 illustrates various disadvantages of previous image sensor architectures, as compared to those of certain embodiments.

Arrangement 250 includes pixel pairs 255a, 255b, 255c. FIG. 2C illustrates a conventional transfer gate design in a shared pixel architecture. More particularly, the pairs of pixels 255a, 255b, 255c each include a respective floating drain which is shared—e.g. where transfer gates 265a, 275a of pixel pair 255a are both coupled to floating drain 280a, where transfer gates 265b, 275b of pixel pair 255b are both coupled to floating drain 280b and where transfer gates 265c, 275c of pixel pair 255c are both coupled to floating drain 280c.

Design variation across the pixels in pixel pairs 255a, 255b, 255c may result in variation in the respective fill factors of the pixels. For example, pixel pair 255a may have a substantially larger ratio of exposed photodiode region 260a to gate region 265a (or exposed photodiode region 270a to gate region 275a) than the ratio of exposed photodiode region 260b to gate region 265b (or of exposed photodiode region 270b to gate region 275b) of pixel pair 250b.

In addition, design rules often dictate, for example, a minimum space between adjacent transfer gates, a minimum distance from a transfer gate to a closest edge of a photodiode, placement of transfer gate contacts, and/or the like, which tend to reduce the fill factor in pixels. For example, design rules according to conventional techniques may require lateral spacing between pixel pairs. To illustrate, pixel pair 255b is shown in relation to pixel pair 255c, wherein transfer gate regions 265b, 275b of pixel pair 250b are laterally separated from photodiodes 260c, 270c of pixel pair 250c. Typically such lateral separation is made by one or more STI regions which are included in, or which are disposed between, the pixel structures of pixel pairs 250b, 250c. As shown in view 200a, conventional pixels include STI regions to separate adjacent photosensitive regions along a horizontal row of pixels as well as between pixels in vertical columns.

Notwithstanding the apparent mirror symmetry of transfer gate pair 265a, 275a (or transfer gate pair 265b, 275b or transfer gate pair 265c, 275c), the diagonal edges of transfer gates 265b, 265c have respective slopes which are of a first (e.g. "positive") general orientation, whereas the diagonal edges of transfer gates 275b, 275c have respective slopes which are of an opposite (e.g. "negative") general orientation. Moreover, variation in pixels' design geometries—e.g. to accommodate a sensing of red light by photodiode region 260a, a sensing of green light by photodiode region 260c and by photodiode region 270b and a sensing of blue light by photodiode region 270c—can result in the diagonal edges of transfer gates 265b, 265c, 275b, 275c having slopes which vary within and/or between pixel pairs. During color processing, the sampled values from each set of green, red, and blue photodiodes are overlaid (to generate an RGB pixel value for each pixel of an image, for example). However, the different transfer gate orientations in the photodiodes in the example often result in an image having skewed colors. Overlaying the colors thus can result in color shading, fixed pattern noise, and/or other imbalances in the image. Accordingly, such asymmetry in arrangement 250 may affect the quality of image data being generated thereby.

Figure 3A:
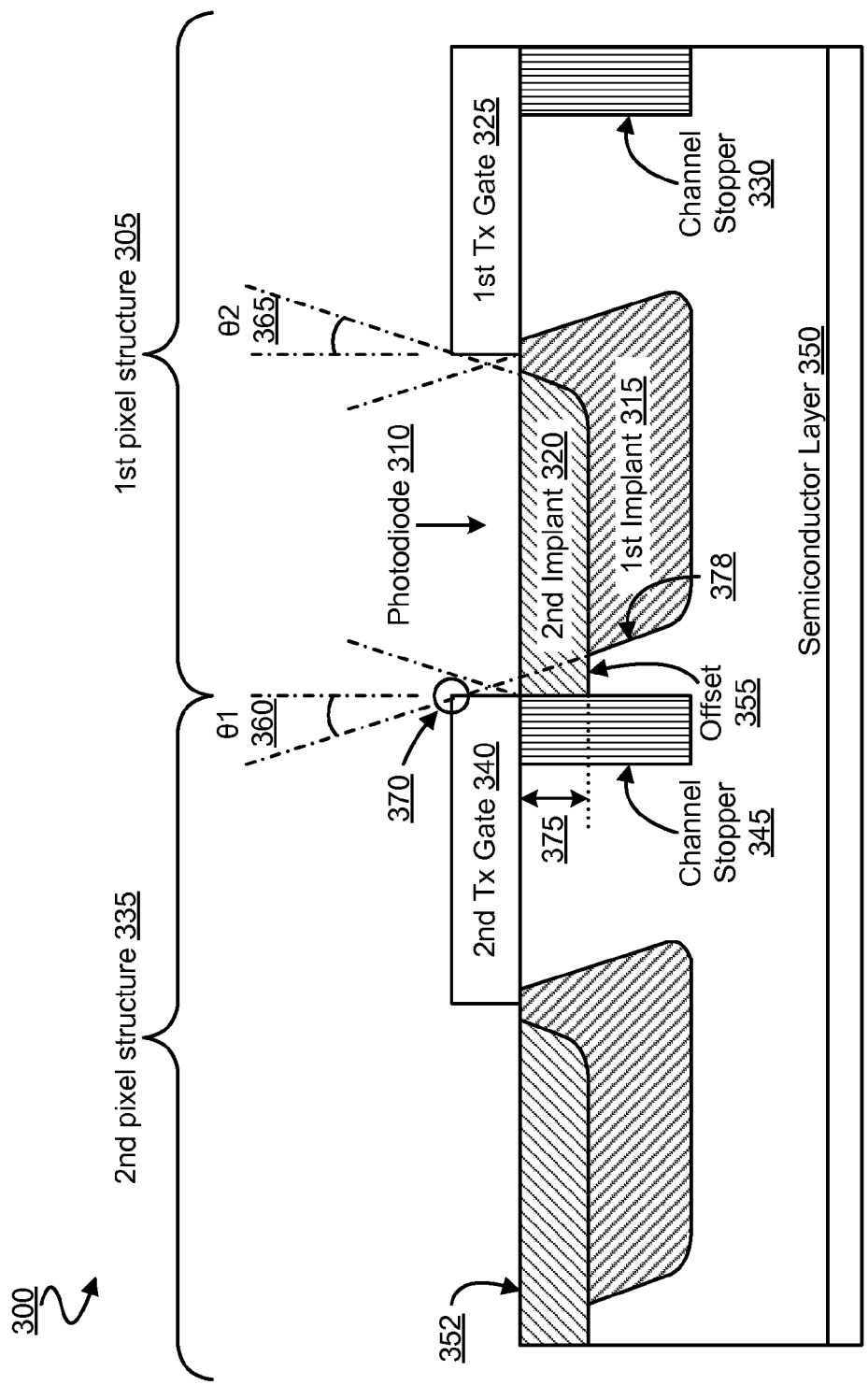
FIG. 3A is a cross-section diagram illustrating a cross-sectional view of an image sensor according to an embodiment.

FIG. 3A illustrates certain elements of an image sensor 300 according to an embodiment. Figures herein are not drawn to scale, unless otherwise indicated. Image sensor 300 may, for example, generate or otherwise provide image data for digital photographs and/or digital video. In an embodiment, image sensor 300 includes a semiconductor layer 350 in which, and/or on which, are disposed various structures of respective image sensing pixels. Semiconductor layer 350 may, for example, include a semiconductor material such as that of p-type substrate 245, although certain embodiments are not limited in this regard.

By way of illustration and not limitation, image sensor 300 may include a first pixel structure 305 and a second pixel structure 335. Image sensor 300 may include any of a variety of additional and/or alternative pixel structures, according to various embodiments. Semiconductor layer 350 may include a first channel stopper 330 of first pixel structure 305 and a second channel stopper 345 of second pixel structure 335. Channel stoppers 330, 345 may each comprise respective implant regions to reduce signal cross-talk between adjacent pixel structures.

Although the particular properties of a channel stopper for reducing signal crosstalk may vary according to the implementation details of different embodiments, either or both of channel stoppers 330, 345 may, for example, be comprised of semiconductor material which is p-type doped to within a concentration range of $10^{15}$ atoms/cc to $10^{18}$ atoms/cc and/or to within a range of depths from 0.1 μm to 1.0 μm. Such properties are merely illustrative, however, and are not limiting on certain embodiments.

In an embodiment, either or both of channel stoppers 330, 345 include only a doped semiconductor material—e.g. allowing structures of first pixel structure 305 and structures of second pixel structure 335 to adjoin one another without any STI structures separating them.

In an embodiment, image sensor 300 includes a first transfer gate 325 of first pixel structure 305 and a second transfer gate 340 of second pixel structure 335—e.g. the transfer gates 325, 340 adjoining a surface 352 of semiconductor layer 350. Either or both of transfer gates 325, 340 may implement functionality corresponding to that of transfer gate 215, for example. Either or both of transfer gates 325, 340 may include respective component structures (not shown) such as gate oxides, gate electrodes and/or the like. Transfer gates 325, 340 may at least partially overlap channel stoppers 330, 345, respectively.

First pixel structure 305 may include a photodiode 310 having a first implant region 315 in semiconductor layer 350. Functionality of first implant region 315 may correspond to that of N-type layer 235, for example. In an embodiment, first implant region 315 includes an N-type photodiode layer, although certain embodiments are not limited in this regard. First implant region 315 may be formed by exposing at least a portion of a region of surface 352 to an ion implantation—e.g. where the region of surface 352 is between first transfer gate 325 and second transfer gate 340. In an embodiment, first implant region 315 is skewed within semiconductor layer 350—e.g. where the skew corresponds to a first angle θ1 360 of an angled ion implant process. First angle θ1 360 may be oblique to surface 352. For example, some portion of first implant region 315—e.g. at least a portion which is beneath a second implant region 320 of first photodiode 310—may have a generally rhomboid profile which is angled in a direction toward first transfer gate 325 with increasing depth in semiconductor layer 350.

Photodiode 310 may further include second implant region 320 in semiconductor layer 350—e.g. where second implant region 320 at least partially overlaps first implant region 315. Functionality of second implant region 320 may correspond to that of P+ pinned layer 210, for example. In an embodiment, second implant region 320 includes a P+ pinned layer, although certain embodiments are not limited in this regard. Second implant region 320 may also be formed by exposing at least some portion of a region of surface 352 to another ion implantation—e.g. a portion of the same region of surface 352 which is between first transfer gate 325 and second transfer gate 340. In an embodiment, second implant region 320 is also skewed within semiconductor layer 350—e.g. where the skew of second implant region 320 corresponds to a second angle θ2 365 of an angled ion implant process. Second angle θ2 365 may, for example, be oblique to surface 352.

The various dimensions of image sensor 300 may vary according to the implementation details of different embodiments. For example, a separation of transfer gates 325, 340 from one another may be between 0.75 µm and 3.0 µm, in an embodiment. Additionally or alternatively, first implant region 315 may, for example, overlap first transfer gate 325 by 0.01 µm to 0.5 µm. Additionally or alternatively, first implant region 315 may, for example, extend to a depth below surface 352 of 0.5 µm to 2.0 µm. Additionally or alternatively, second implant region 320 may, for example, extend to a depth below surface 352 of 0.1 µm to 0.25 µm. First implant angle θ1 360 may, in an embodiment, be in a range of 30° to 60°, and/or second implant angle θ2 365 may, for example, be in a range of 30° to 60° in a direction opposite to that of first implant angle θ1 360. Such dimensions are merely illustrative, however, and are not limiting on certain embodiments.

Figure 3B:
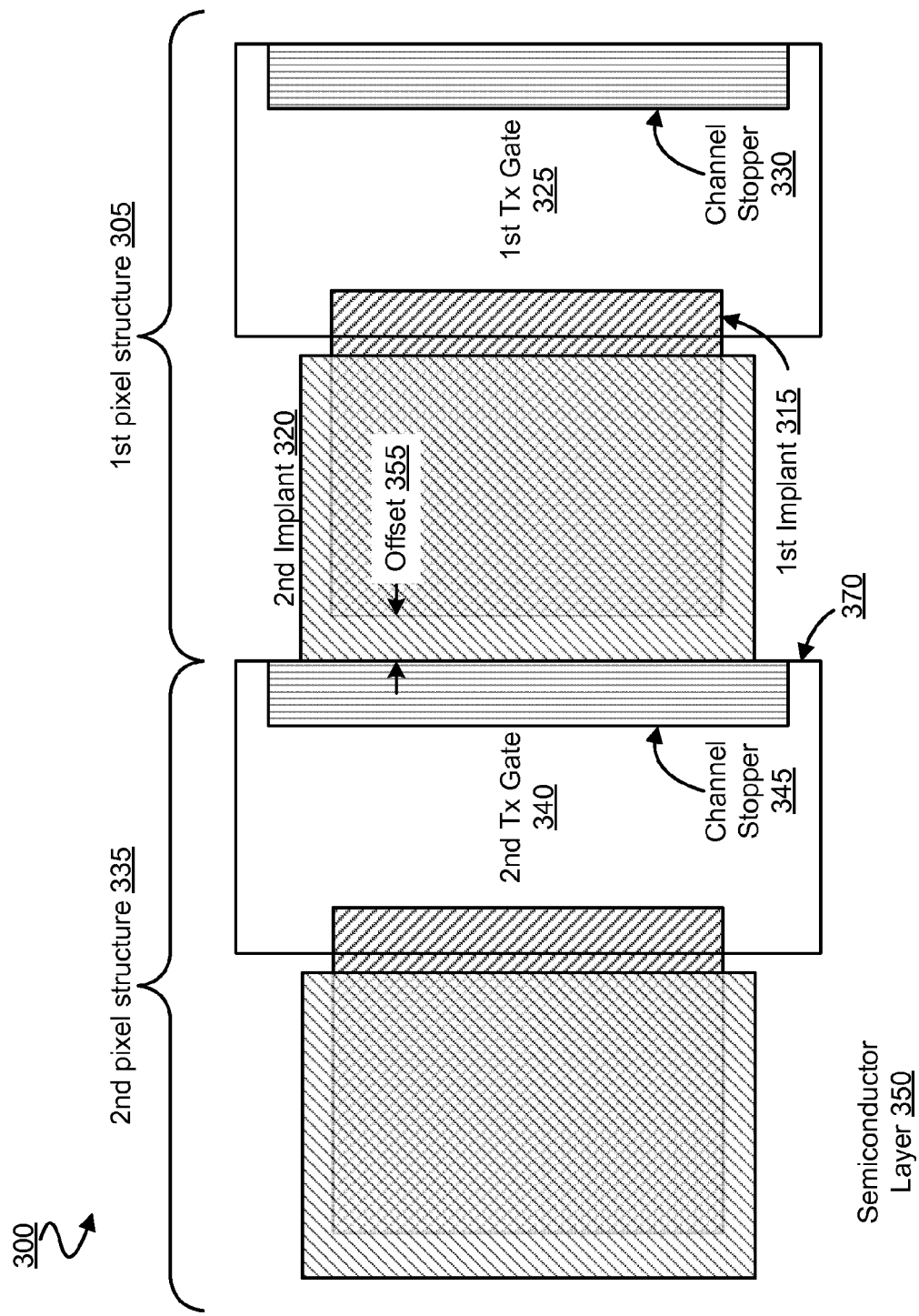
FIG. 3B is a layout diagram illustrating a top view of an image sensor according to an embodiment.

In an embodiment, a rim 370 of second transfer gate 340 defines an edge of that portion of surface 352 which is exposed to the ion implant at first implant angle θ1 360. Rim 370 may include, or otherwise be determined by, one or more curved and/or linear edge portions which are located at a given height above surface 352. Consequently, a boundary of first implant layer 315 may be determined at least in part by the height and/or shape of rim 370. For example, a boundary 378 of first implant layer 315 may follow at least in part a plane which includes rim 370 and which is oblique to surface 352 at first angle θ1 360. As shown in FIG. 3B, boundary 378 may run parallel to rim 370, where an edge of boundary 378 is at an offset 355 from the side of second transfer gate 340 in a direction on surface 352. In this sense, first implant region 315—e.g. a boundary 378 thereof—may be said to be aligned with rim 370 according to first angle θ1 360, where boundary 378 is also skewed in semiconductor layer 350 according to that same first angle θ1 360.

In certain embodiments, at least some portion of boundary 378 may follow the plane including rim 370 while also being offset from such a plane, e.g. where implant ion diffusion characteristics associated with semiconductor layer 350 and first implant layer 315 have resulted in that portion of boundary 378 being offset from the plane. In this sense, alignment of first implant region 315 with rim 370 may further be said to be according to implant ion diffusion of the first implant region.

In an embodiment, second implant region 320 is implanted into semiconductor layer 350 after first implant region 315. Second implant region 320 may, for example, extend to a depth 375 from surface 352. The geometry of depth 375, the height of rim 370 and first implant angle θ1 360 may determine an offset 355 of a side of second transfer gate 340 from a closest edge of first implant region 315—e.g. the offset 355 in a direction parallel to surface 352. For example, offset 355 may correspond to first implant angle θ1 360 and to a sum of depth 375 and the height of rim 370—e.g. according to the following:

$$\text{offset } 355 \approx [\tan(\theta 1)][(\text{height of rim } 370)+(\text{depth } 375)] \quad (1)$$

In an embodiment, one or more of the boundaries of first implant region 315 (which define the region exhibiting non-linear electrical properties for photodiode operation) may be more curved than, and/or offset from, the somewhat idealized, linear boundaries shown in FIG. 3A. Such curved and/or offset boundaries may, for example, be due to implanted ions diffusing in semiconductor layer 350 according to a concentration of doping in first implant region 315, the doping properties of semiconductor layer 350 and/or the like. Indeed, certain embodiments rely upon such diffusion for first implant region 315 to be in direct contact with the bottom of first transfer gate 325. Nevertheless, such curved/offset boundaries may, in an embodiment, exhibit a skew which is characteristic of first implant angle θ1 360. However, as a result, offset 355 may vary from equation (1)—e.g. where offset 355 is smaller by some amount ∈ corresponding to ion diffusion properties of photodiode 310. In an embodiment, offset 355 is within a range of 0.05 µm to 0.5 µm.

In an embodiment, first transfer gate 325 may define another edge of that portion of surface 352 which is exposed to the ion implant at first implant angle θ1 360. Accordingly, first transfer gate 325 may determine an extent to which first transfer gate 325 overlaps first implant region 315. Such overlap is to be distinguished, for example, from the extent to which first implant region 315 may be in direct contact with the bottom of first transfer gate 325. In an embodiment, the overlap of first implant region 315 by first transfer gate 325 may correspond to the first implant angle θ1 360 and a depth to which first implant region 315 extends below surface 352.

In an embodiment, second implant layer 320 may span offset 355—e.g. where second implant layer 320 extends from an edge of first implant region 315 to channel stopper 345. Additionally or alternatively, a rim of first transfer gate 325 defines an edge of that portion of surface 352 which is exposed to the ion implant at second implant angle θ2 365. Consequently, a height of the rim of first transfer gate 325 and the second implant angle θ2 365 may determine at least in part a corresponding offset of a side of first transfer gate 325 from a closest edge of second implant region 320—e.g. the offset in a direction parallel to surface 352.

FIG. 3B illustrates a top view of the image sensor 300 shown in FIG. 3A. In FIG. 3B, first transfer gate 325 of first pixel structure 305 and second implant region 320 of second pixel structure 335 define respective edges of a region of semiconductor layer 350. First implant region 315 and second implant region 320 may each reside at least in part in this region of semiconductor layer 350. As discussed herein, an offset 355 of a nearest edge of first implant region 315 from a side of second transfer gate 340 may correspond to an implant angle associated with first implant region 315—e.g. where a skew of first implant region 315 corresponds to the implant angle. In an embodiment, second implant region 320 may span the offset 355—e.g. where the second implant region 320 extends between the first implant region 315 and channel stopper 354 of second pixel structure 335.

In an embodiment, rim 370 provides for self-alignment of a boundary of first implant region 315 with second transfer gate 340—e.g. where such boundary runs parallel to the rim 370 at a consistent offset 355 from second transfer gate 340. By using rim 370 as a basis for such alignment, offset 355 can approach minimum values—allowing for an increased footprint, and improved operation, of photodiode 310 with better FWC.

FIG. 3C illustrates elements of an image sensor 380 which includes one or more pixel structures of a type corresponding to that shown in FIGS. 3A and 3B. In image sensor 380, four pixel structures include respective transfer gates 390a, 390b, 390c, 390d and respective photodiodes 395a, 395b, 395c, 395d. Image sensor 380 may include any of a variety of additional or alternative pixel structures, according to various embodiments. For clarity, various additional components of the pixel structures in image sensor 380 are not shown. In an embodiment, transfer gates 390a, 390b, 390c, 390d variously facilitate exchanges of charge accumulated, respectively, by photodiodes 395a, 395b, 395c, 395d. To facilitate such exchanges, transfer gates 390a, 390c may share a connection to a floating diffusion 395x, and transfer gates 390b, 390d may share a connection to a floating diffusion 395y. The increased symmetry of the transfer gates 390a, 390b, 390c, 390d, as compared to that shown in FIG. 2C, can be easily seen.

Moreover, the architecture of image sensor 380 allows for all, or nearly all, of the area between transfer gates of adjoining pixel structures to be occupied by implant regions of photodiodes and/or allows the elimination of STI structures which might otherwise separate adjacent pixels structures. The elimination of STI structures between the laterally spaced pixel elements allows for an increased fill factor.

In an embodiment, elements of a plurality of pixel structures reside within in a region of a semiconductor layer, wherein one or more STI structures and one or more floating diffusion structures define a perimeter of that region of the semiconductor layer. Such a plurality of pixel structures may further include one or more component elements which are disposed on the region—e.g. including one or more transfer gates adjoining the surface of the semiconductor layer.

The region of the semiconductor layer which is bounded by the one or more STI structures and one or more floating diffusion structures may, for example, include elements of different respective pixel structures which are not separated from one another by any STI structure. In an embodiment, the plurality of pixel structures having elements within the region of the semiconductor layer may share the one or more floating diffusion structures with one or more pixel structures which reside outside of that region of the semiconductor layer.

Figure 4:
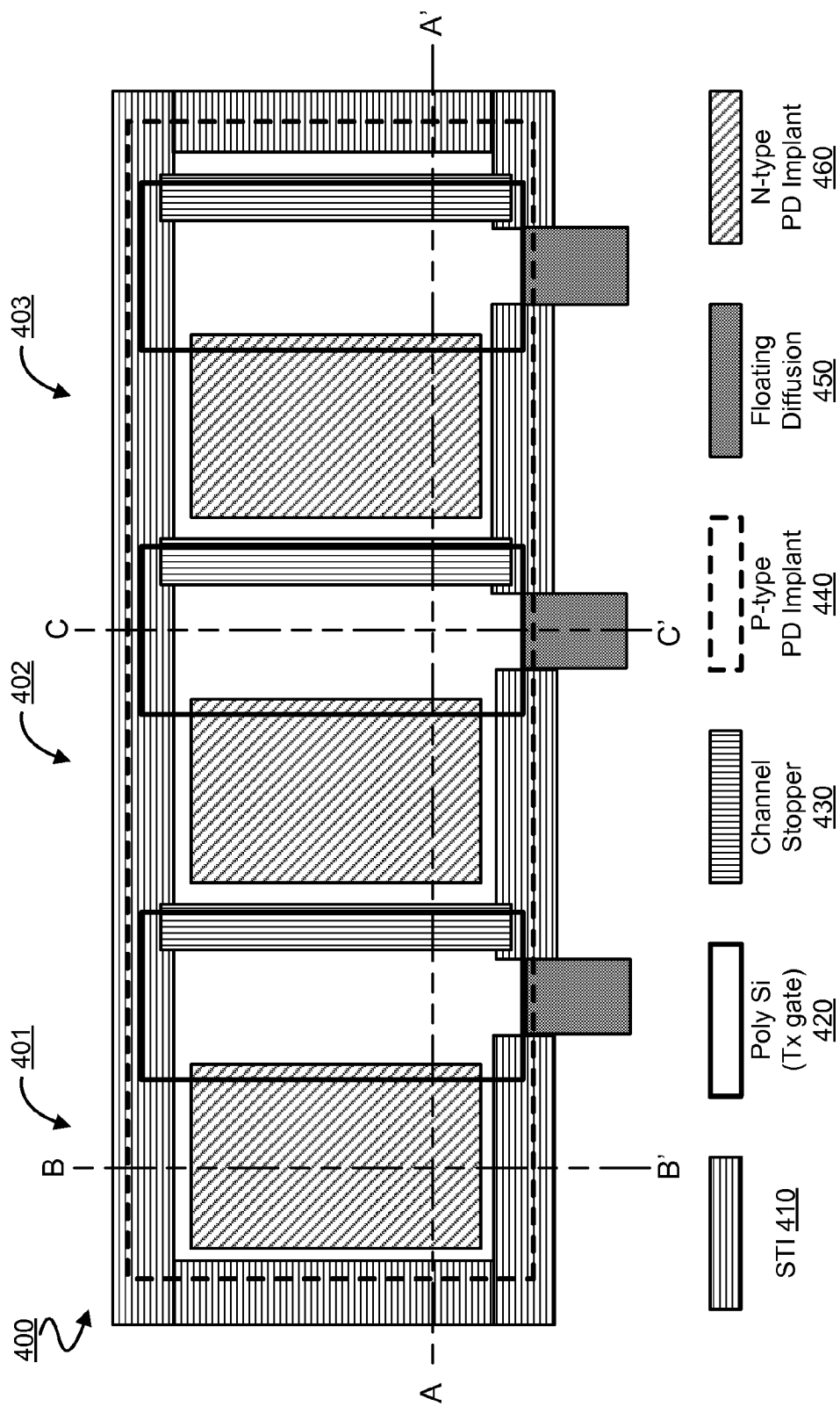
FIG. 4 is a layout diagram illustrating a top view of an image sensor according to an embodiment.

By way of illustration and not limitation, a pixel array structure 400 according to one embodiment is shown in FIG. 4. A top view illustrating portions of 3 pixel elements of pixel array structure 400 is shown in FIG. 4, where each pixel in the group (e.g. row) has a single photodiode, a single channel stopper, a single transfer gate and a shared floating diffusion per pixel. FIG. 4 illustrates a first pixel element 401 having a photodiode region 460, where an STI isolation region 410 is disposed along three of the sides of the first photodiode region 460, while a first transfer gate 420 and first channel stopper 430 are arranged along a fourth side of the first photodiode region 460. The first transfer gate 420 has one associated first floating diffusion 450. The first floating diffusion region 450 is disposed between vertically adjacent transfer gates 420 (in pixel element row below pixel row 400 and not shown) and can be shared as discussed above with respect to FIG. 3C. As described earlier photoelectrons generated and collected in the photodiode are transferred under the transfer gate to the floating diffusion region during imaging. The channel stopper prevents signal carrier exchange (cross talk) between adjacent pixel elements.

FIG. 4 also illustrates a second pixel element 402 having a second photodiode region 460 that has STI isolation regions 410 along two of the sides of the second photodiode region 460. A second transfer gate 420 and channel stopper 430 are arranged along a third side of the second photodiode region 460. On the fourth side of the second pixel element 402 the second photodiode region is arranged adjacent to the first transfer gate 420 and first channel stopper of the first pixel element. The second transfer gate 420 has one associated second floating diffusion 450. The second floating diffusion region 450 is disposed between vertically adjacent transfer gates 420 (in a pixel element row below pixel row 400 and not shown) and can be shared as discussed above with respect to FIG. 3C.

FIG. 4 also illustrates a third pixel element 403 having a third photodiode region 460, a third transfer gate 420, and a third channel stopper 430. STI isolation regions 410 lie along three of the sides of the third pixel element 403, while on the fourth side of the third pixel element the third photodiode region 460 is arranged adjacent to the second transfer gate 420 and second channel stopper 430 of the second pixel element along the side of the second pixel element in common with the third pixel element. The third transfer gate 420 has one associated third floating diffusion 450. The third floating diffusion region 450 is disposed between vertically adjacent transfer gates 420 (in a pixel element row below pixel row 400 and not shown) and can be shared as discussed above with respect to FIG. 3C. Cross section view lines A-A', B-B', and C-C' as illustrated in FIG. 4 are discussed below.

Figure 5:
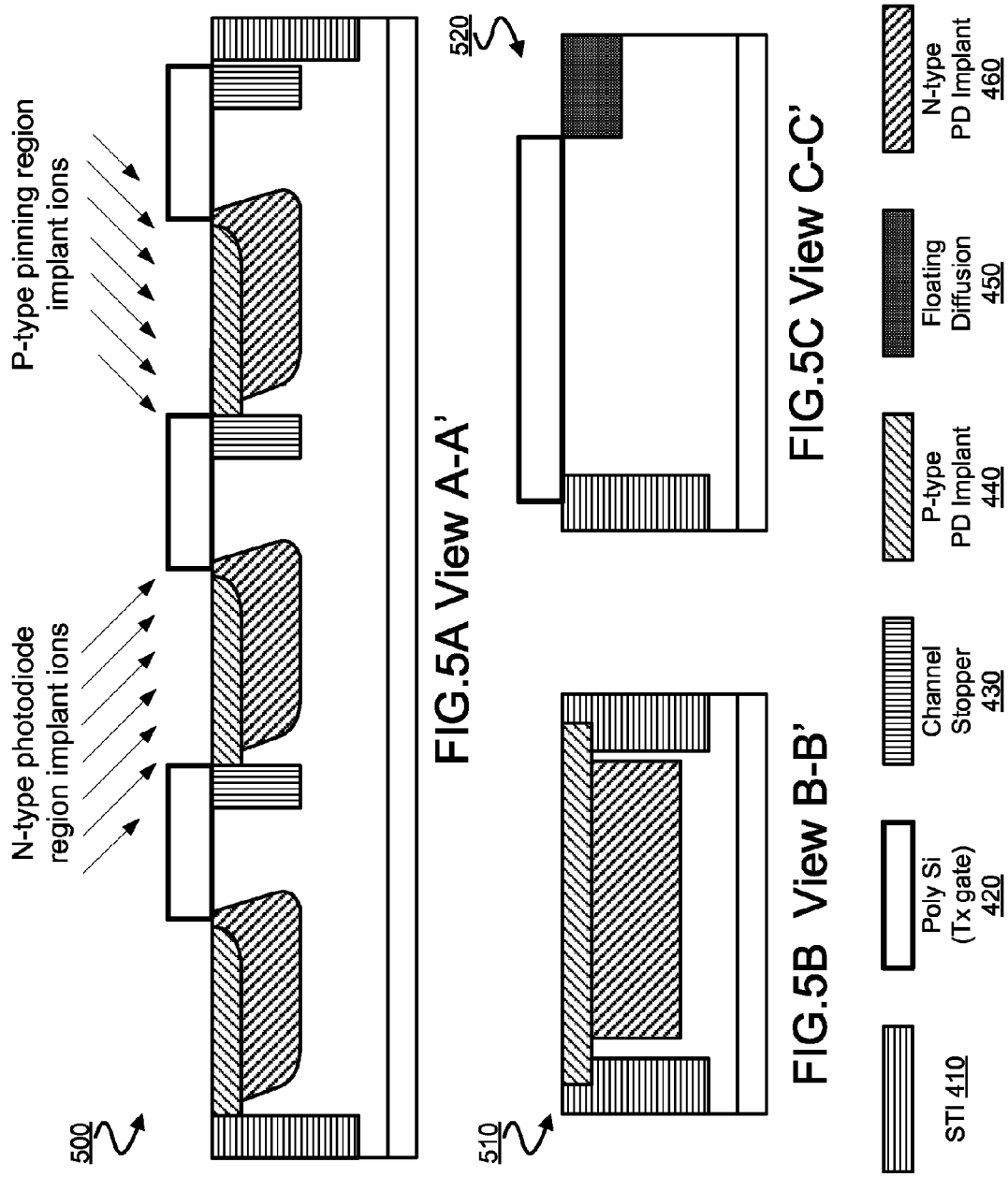
FIGS. 5A-5C are cross section diagrams illustrating cross-sectional views of an image sensor according to an embodiment.

FIG. 5A illustrates a first cross-section view 500 (view A-A') of FIG. 4. As illustrated, each of the pixel elements 401, 402, and 403 contain a photodiode region 460 having a portion that extends beneath a transfer gate 420, and a channel stopper region 430 having a portion that extends beneath a transfer gate 420, and a p-type implant region 440 (pinning implant) above a photodiode region 460, and STI regions 410. Certain embodiments variously provide self-alignment of both p-type pinning region implant 440 and n-type photodiode implant 460 to transfer gate 420—e.g. through the use of angled ion implantation. For example, an electrode of polysilicon transfer gate 420 may be of sufficient thickness that its height acts as a shadow mask to various illustrated ion implants—e.g. implants for p-type implant regions 440. The use of the angled ion implant to form an offset of photodiode regions 460 from opposite edges of respective transfer gates 420 helps implement efficient photodiode structures disclosed herein.

FIG. 5B illustrates a second cross-section view 510 (view B-B') of FIG. 4. As illustrated, cross-section view 510 shows the n-type photodiode region 460 overlaid by the p-type pinning region 440 and two STI regions 410 on either side. In an embodiment, the photodiode regions 440, 460 occupy a p-type doped substrate (or p-type well).

FIG. 5C illustrates a third cross-section view 520 (view C-C') of FIG. 4. As illustrated, cross section view 520 shows the transfer gate electrode 420 over the p-type well/channel region with an STI isolation region 410 at one end and the floating diffusion 450 at the other end. When the transfer gate 420 is activated, electrons having been collected in the photodiode region are transferred to the floating diffusion region 450. The transfer path involves a right angle path rather than a straight-through path typical of a standard transfer transistor.

Figure 6:
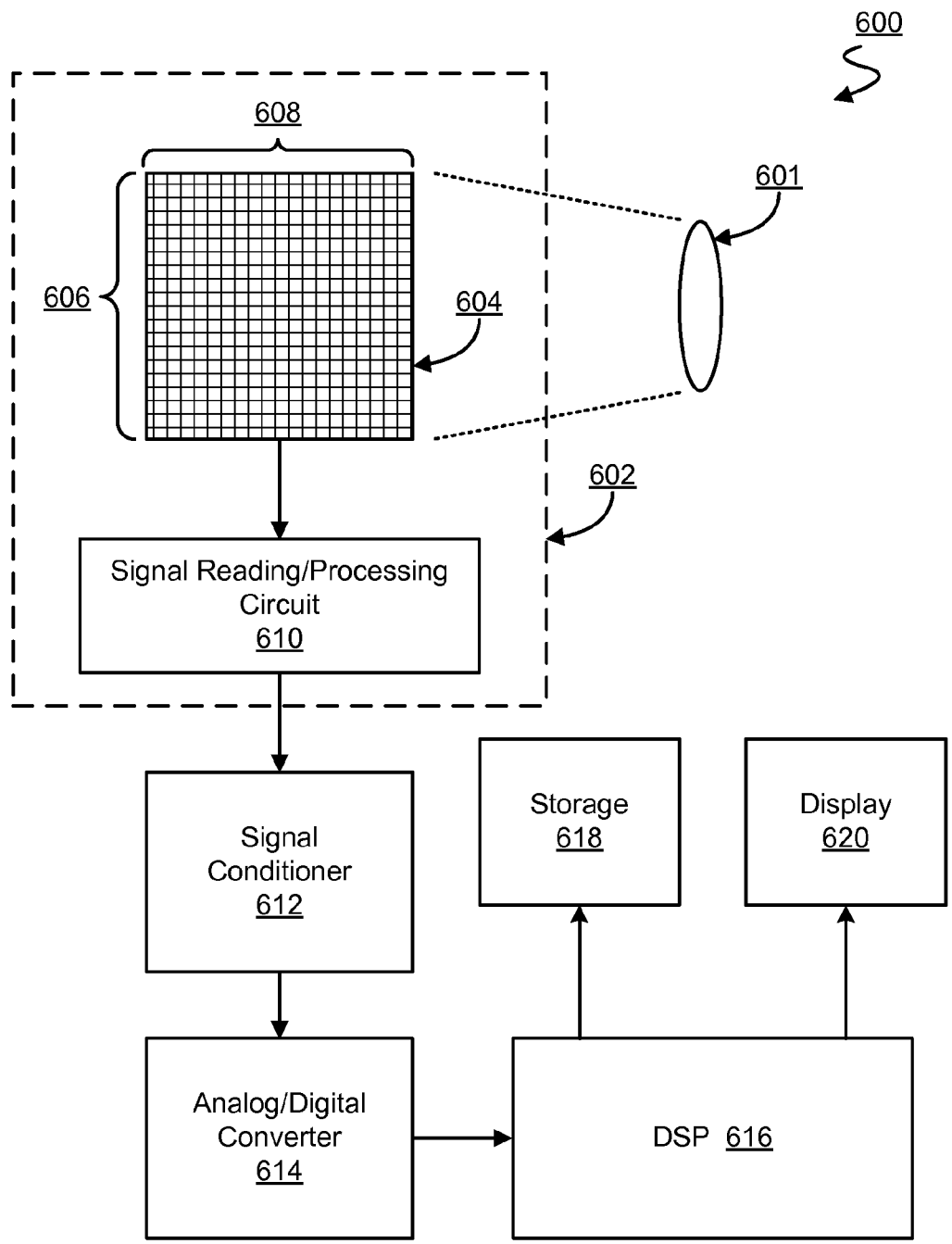
FIG. 6 is a block diagram illustrating elements of an imaging system according to an embodiment.

FIG. 6 illustrates elements of an imaging system 600 according to an embodiment. Imaging system 600 may include optics 601—e.g. any of a variety of combinations of refractive, diffractive and/or reflective optical elements—and an image sensor 602 coupled thereto. In an embodiment, optics 601 may focus an image onto pixels in a pixel array 604 of image sensor 602. Pixel array 604 may capture the image for other circuitry of imaging system 600 to process—e.g. to generate pixel data representing the image.

Image sensor 602 may comprise, for example, pixel array 604 and a signal reading and processing circuit 610 coupled thereto. In one embodiment, image sensor 602 is a backside illuminated (BSI) image sensor including a pixel array 604 having a plurality of pixels arranged in rows 606 and columns 608. Alternatively, image sensor 602 may be a front side illuminated (FSI) image sensor or an image sensor that combines BSI with FSI. In one embodiment, one or more of the pixels in pixel array 604 may comprise an arrangement such as that shown in FIGS. 4 and 5A-5C. Additionally or alternatively, one or more pixels in pixel array 604 may comprise any of various other pixel structure arrangements discussed herein. Pixel array 604 is merely illustrative, and is not limiting on certain embodiments. By way of illustration and not limitation, pixel array 604 may have any of a variety of additional or alternative rows and/or columns.

During operation of pixel array 604 to capture an image, pixels in pixel array 604 may capture incident light (i.e., photons) during a certain exposure period and convert the collected photons into an electrical charge. The electrical charge generated by one of such pixels may be read out as an analog signal—e.g. where a characteristic of the analog signal such as its charge, voltage or current may be representative of an intensity of light that was incident on that pixel during the exposure period.

Moreover, in different embodiments pixel array 604 may include a color image sensor—e.g. including red, green, and blue pixels designed to capture images in the visible portion of the spectrum—a black-and-white image sensor and/or an image sensor designed to capture images in the invisible portion of the spectrum, such as infra-red or ultraviolet.

Image sensor 602 may include signal reading and processing circuit 610. Among other things, circuit 610 may include circuitry and logic that methodically reads analog signals from each pixel, filters these signals, corrects for defective pixels, and so forth. In an embodiment where circuit 610 performs only some reading and processing functions, the remainder of the functions can be performed by one or more other components such as a signal conditioner 612 or a digital signal processor (DSP) 616 of imaging system 600. Although shown as an element separate from pixel array 604, in some embodiments reading and processing circuit 610 can be integrated with pixel array 604 on the same substrate or can comprise circuitry and logic embedded within the pixel array. In other embodiments, however, reading and processing circuit 610 can be an element external to pixel array 604. In still other embodiments, reading and processing circuit 610 can be an element not only external to pixel array 604, but also external to image sensor 602.

Imaging system 600 may include a signal conditioner 612—e.g. coupled to image sensor 602—to receive and condition analog signals from pixel array 604 and/or reading and processing circuit 610. In different embodiments, signal conditioner 612 can include various components for conditioning analog signals. Examples of components that can be found in the signal conditioner 612 include filters, amplifiers, offset circuits, automatic gain control, etc. In an embodiment where signal conditioner 612 includes only some of these elements and performs only some conditioning functions, the remaining functions may be performed by one or more other components such as circuit 610 or DSP 616. In an embodiment, an analog-to-digital converter (ADC) 614 may be coupled to signal conditioner 612 to receive conditioned analog signals—e.g. the conditioned signals corresponding to each pixel in pixel array 604 from signal conditioner 612—and to convert these analog signals into digital values.

Imaging system 600 may include a DSP 616—e.g. coupled to analog-to-digital converter 614—to receive digitized pixel data from ADC 614 and to process the digital data to produce a final digital image. DSP 616 may, for example, include a processor and an internal memory (not shown) in which it can store and retrieve data. After the image is processed by DSP 616, it can be output to one or both of a storage unit 618 such as a flash memory or an optical or magnetic storage unit and a display unit 620 such as an LCD screen.

Figure 7:
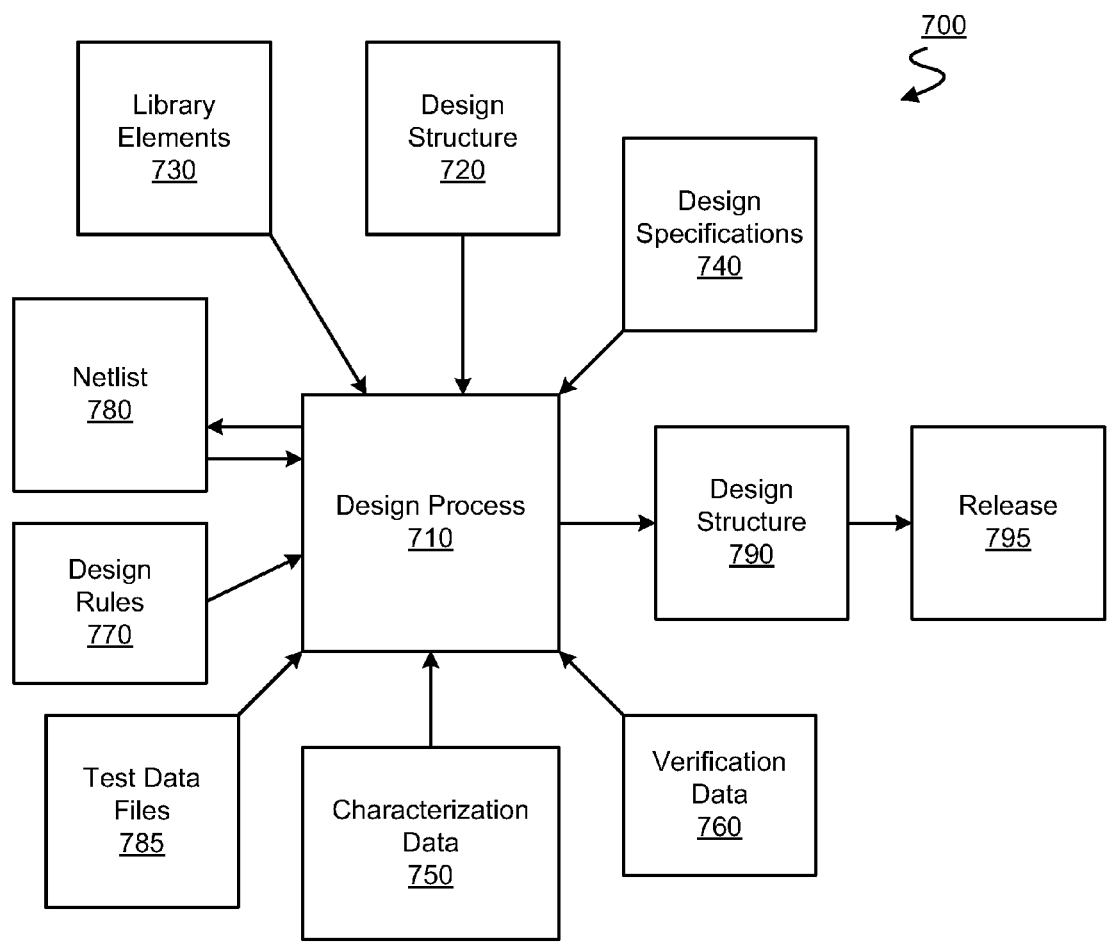
FIG. 7 is a block diagram illustrating elements of a design flow for design and manufacturing an image sensor pixel array according to an embodiment.

FIG. 7 shows a block diagram of an exemplary design flow 700 used for example, in semiconductor design and manufacturing of the image sensor pixel array and semiconductor circuits according to the present invention. Design structure 720 may include an input to a design process 710, wherein design structure 720 comprises data describing structures according to an embodiment—such as those shown in any of FIGS. 3A-3C, 4 and 5A-5C—in the form of schematics or hardware description language (HDL; e.g., Verilog, VHDL, C, etc.). The design structure 720 may be a text file or a graphical representation of an embodiment of the invention, e.g. as shown in some or all of FIGS. 3A-3C, 4 and 5A-5C.

A machine readable storage medium embodying a design structure may be provided. For example, the design structure may include first data representing a first pixel structure including a first photodiode in a semiconductor layer, the first photodiode having a first implant region, wherein a skew of the first implant region corresponds to a first implant angle. The first data representing a first pixel structure may further represent both a second implant region at least partially overlapping the first implant region and a first transfer gate adjoining a surface of the semiconductor layer. The design structure may further include second data representing a second pixel structure including a second transfer gate adjoining the surface of the semiconductor layer, wherein an offset of the first implant region from the second transfer gate corresponds to the first implant angle and a sum of a height of the second transfer gate and a thickness of the second implant region. A physical structure represented by each of the data of the design structure the may be the physical structures described above.

Design process 710 preferably synthesizes (or translates) an embodiment of the invention—e.g. as shown in some or all of FIGS. 3A-3C, 4 and 5A-5C—into a netlist 780, where netlist 780 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which the netlist 780 is resynthesized one or more times depending on design specifications and parameters of the circuit.

The design process 710 may include using a variety of inputs; for example, inputs from library elements 730 which may house a set of commonly used elements, circuits, and devices, including models, layouts, and symbolic representations, for a given manufacturing technology (e.g., different technology nodes such as 32 nm, 45 nm, and 90 nm, etc.), design specifications 740, characterization data 750, verification data 760, design rules 770, and test data files 785 (which may include, for example, standard circuit design processes such as timing analysis, verification, design rule checking, place and route operations, etc.) One of ordinary skill in the art of integrated circuit design can appreciate the extent of possible electronic design automation tools and applications used in the design process 710 without deviating from the scope and spirit of the present invention.

Design process 710 preferably translates an embodiment of the invention—e.g. as shown in some or all of FIGS. 3A-3C, 4 and 5A-5C—along with any additional integrated circuit design or data (if applicable) into a second design structure 790. Design structure 790 resides on a storage medium in a data format used for the exchange of layout data of integrated circuits and/or symbolic data format (e.g., information stored in GDS11 (GDS2), GL1, OASIS, map files, or any other suitable format for storing such design structures). Design structure 790 may comprise information, for example, symbolic data, map files, test data files, design content files, manufacturing data, layout parameters, wires, levels of metal, vias, shapes, data for routing through the manufacturing line, and any other data required by a semiconductor manufacturer to produce one of the embodiments of the present invention as shown in FIGS. 4-5. Design structure 790 may then proceed to a stage 795 where, for example, design structure 790 proceeds to tapeout, is released to manufacturing, is released to a mask house, is sent to another design house, is sent back to a customer, etc.

Figure 8:
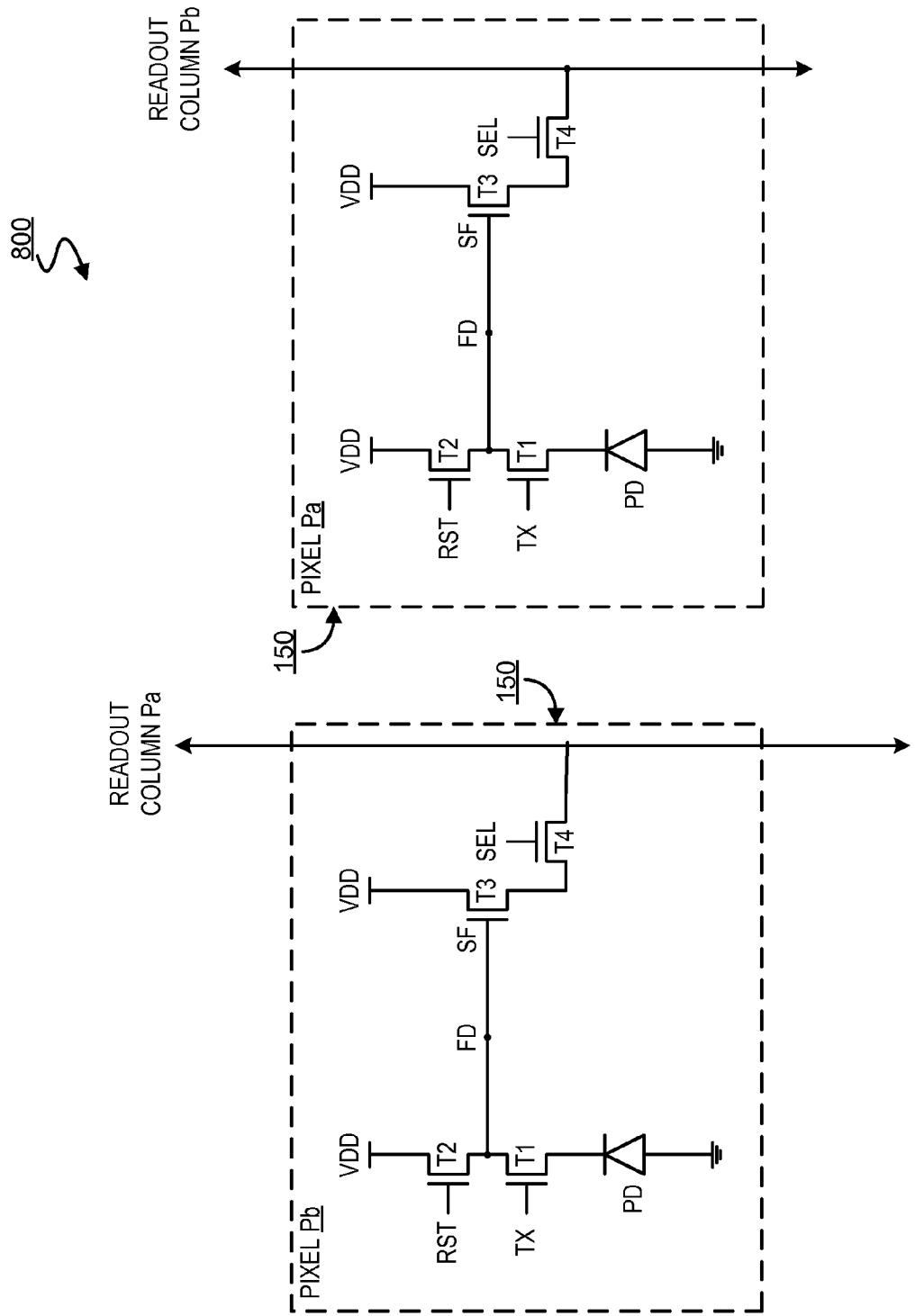
FIG. 8 is a circuit diagram illustrating elements of pixel circuitry within an imaging array according to an embodiment.

FIG. 8 is a circuit diagram illustrating pixel circuitry 800 of two four-transistor ("4T") pixels within an imaging array, in accordance with an embodiment of the invention. Pixel circuitry 800 is but one possible pixel circuitry architecture for implementing pixels within pixel array 400 of FIG. 4. However, it should be appreciated that certain embodiments are not limited to 4T pixel architectures; but that 5T designs, and various other pixel architectures can be used.

In FIG. 8, pixels Pa and Pb are arranged in one row and two columns. The imaging array comprising pixels Pa and Pb may contain hundreds of rows and columns, for example. The illustrated embodiment of each imaging pixel circuitry 800 includes a photodiode PD, a transfer transistor T1, a reset transistor T2, a source-follower ("SF") transistor T3, and a select transistor T4. During operation, transfer transistor T1 receives a transfer signal TX, which transfers the charge accumulated in photodiode PD to a floating diffusion node FD.

Reset transistor T2 is coupled between a power rail VDD and the floating diffusion node FD to reset (e.g., discharge or charge the FD to a preset voltage) under control of a reset signal RST. The floating diffusion node FD is coupled to the gate of SF transistor T3. SF transistor T3 is coupled between the power rail VDD and select transistor T4. SF transistor T3 operates as a source-follower providing a high impedance output from floating diffusion node FD. Finally, select transistor T4 selectively couples the output of imaging pixel circuitry 800 to the readout column line under control of a select signal SEL. In one embodiment, the TX signal, the RST signal, and the SEL signal are generated by control circuitry. The TX signal, the RST signal, the SEL signal, VDD, and ground may be routed in imaging pixel circuitry 800 by way of metal interconnect layers. In one embodiment, transistors T1, T2, T3, and T4, photodiode PD and floating diffusion node FD may be connected as shown in FIG. 8 by way of metal interconnect layers.

Techniques and architectures for providing image sensing structures are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An image sensor apparatus comprising:
   a pixel array including:
      a first pixel structure including:
         a first photodiode in a semiconductor layer, the first photodiode including a first implant region and a second implant region at least partially overlapping the first implant region, the first implant region is skewed according to a first implant angle; and
         a first transfer gate adjoining a surface of the semiconductor layer; and
      a second pixel structure including a second transfer gate adjoining the surface of the semiconductor layer, wherein a boundary of the first implant region is aligned with a rim of the second transfer gate according to the first implant angle; and
   readout circuitry coupled to the pixel array, the readout circuitry to generate image data based on signals from the pixel array.

2. The image sensor apparatus of claim 1, wherein alignment of the first implant region with the rim of the second transfer gate is further according to ion implant diffusion of the first implant region.

3. The image sensor apparatus of claim 1, further comprising a channel stopper in the semiconductor layer adjacent to the first implant layer, the channel stopper including only a doped semiconductor material, wherein the second transfer gate at least partially overlaps the channel stopper.

4. The image sensor apparatus of claim 3, wherein the second implant region spans a gap between the channel stopper and the first implant region.

5. The image sensor apparatus of claim 1, wherein the first pixel structure and second pixel structure are adjacent to one another, with no shallow trench isolation structure between the first pixel structure and the second pixel structure.

6. The image sensor apparatus of claim 1, wherein elements of the first pixel structure and the second pixel structure reside in a region of the semiconductor layer, and wherein the pixel array further comprises one or more shallow trench isolation structures and one or more floating diffusion structures, wherein the one or more shallow trench isolation structures and one or more floating diffusion structures define a perimeter of the region of the semiconductor layer.

7. The image sensor apparatus of claim 6, further comprising a plurality of pixel structures including elements residing outside the region of the semiconductor layer, wherein the plurality of pixel structures share the one or more floating diffusion structures with the first pixel structure and the second pixel structure.

8. A pixel array comprising:
   a first pixel structure including:
      a first photodiode in a semiconductor layer, the first photodiode including a first implant region and a second implant region at least partially overlapping the first implant region, wherein the first implant region is skewed according to a first implant angle; and
      a first transfer gate adjoining a surface of the semiconductor layer; and
   a second pixel structure including a second transfer gate adjoining the surface of the semiconductor layer, wherein a boundary of the first implant region is aligned with a rim of the second transfer gate according to the first implant angle.

9. The pixel array of claim 8, wherein alignment of the first implant region with the rim of the second transfer gate is further according to ion implant diffusion of the first implant region.

10. The pixel array of claim 8, further comprising a channel stopper in the semiconductor layer adjacent to the first implant layer, the channel stopper including only a doped semiconductor material, wherein the second transfer gate at least partially overlaps the channel stopper.

11. The pixel array of claim 10, wherein the second implant region spans a gap between the channel stopper and the first implant region.

12. The pixel array of claim 8, wherein the first pixel structure and second pixel structure are adjacent to one another, with no shallow trench isolation structure between the first pixel structure and the second pixel structure.

13. The pixel array of claim 8, wherein elements of the first pixel structure and the second pixel structure reside in a region of the semiconductor layer, and wherein the pixel array further comprises one or more shallow trench isolation structures and one or more floating diffusion structures, wherein the one or more shallow trench isolation structures and one or more floating diffusion structures define a perimeter of the region of the semiconductor layer.

14. The pixel array of claim 13, further comprising a plurality of pixel structures including elements residing outside the region of the semiconductor layer, wherein the plurality of pixel structures share the one or more floating diffusion structures with the first pixel structure and the second pixel structure.

15. A non-transitory computer-readable storage medium embodying a design structure, the design structure comprising:
   first data representing a first pixel structure including:
      a first photodiode in a semiconductor layer, the first photodiode including:
         a first implant region and a second implant region at least partially overlapping the first implant region, wherein the first implant region is skewed according to a first implant angle; and
         a first transfer gate adjoining a surface of the semiconductor layer; and
   second data representing a second pixel structure including a second transfer gate adjoining the surface of the semiconductor layer, wherein a boundary of the first implant region is aligned with a rim of the second transfer gate according to the first implant angle.

16. The computer-readable storage medium of claim 15, wherein alignment of the first implant region with the rim of the second transfer gate is further according to ion implant diffusion of the first implant region.

17. The computer-readable storage medium of claim 15, wherein a skew of the second implant region corresponds to a second implant angle.

18. The computer-readable storage medium of claim 15, wherein the first pixel structure and second pixel structure are adjacent to one another, with no shallow trench isolation structure between the first pixel structure and the second pixel structure.

19. The computer-readable storage medium of claim 15, wherein elements of the first pixel structure and the second pixel structure reside in a region of the semiconductor layer, and wherein the design structure further comprises data representing one or more shallow trench isolation structures and one or more floating diffusion structures, wherein the one or more shallow trench isolation structures and one or more floating diffusion structures define a perimeter of the region of the semiconductor layer.

20. The computer-readable storage medium of claim 19, the design structure further comprising data representing a plurality of pixel structures including elements residing outside the region of the semiconductor layer, wherein the plurality of pixel structures share the one or more floating diffusion structures with the first pixel structure and the second pixel structure.

* * * * *